(12) United States Patent
Rosso et al.

(10) Patent No.: US 7,668,223 B2
(45) Date of Patent: Feb. 23, 2010

(54) INTEGRATED PHOTONIC SEMICONDUCTOR DEVICES AND METHODS FOR MAKING INTEGRATED PHOTONIC SEMICONDUCTORS DEVICES

(75) Inventors: Marzia Rosso, Turin (IT); Alessandro Stano, Turin (IT); Ruiyu Fang, Turin (IT); Paolo Valenti, Turin (IT); Pietro Della Casa, Turin (IT); Simone Codato, Turin (IT); Cesare Rigo, Turin (IT); Claudio Coriasso, Turin (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/036,049

(22) Filed: Feb. 22, 2008

(65) Prior Publication Data
US 2009/0213884 A1    Aug. 27, 2009

(51) Int. Cl.
*H01S 3/08*    (2006.01)
*H01S 5/00*    (2006.01)
(52) U.S. Cl. .............. 372/96; 372/45.01; 372/46.01
(58) Field of Classification Search .............. 372/43.01, 372/45.01, 46.01, 96
See application file for complete search history.

(56) References Cited

U.S. PATENT DOCUMENTS

| | | | |
|---|---|---|---|
| 6,104,739 A * | 8/2000 | Hong et al. | 372/50.11 |
| 6,606,443 B2 * | 8/2003 | Sato et al. | 385/129 |
| 6,674,784 B2 * | 1/2004 | Takiguchi et al. | 372/96 |
| 2002/0061046 A1 * | 5/2002 | Takiguchi et al. | 372/96 |
| 2003/0007765 A1 * | 1/2003 | Sato et al. | 385/129 |
| 2003/0147434 A1 * | 8/2003 | Hong et al. | 372/25 |
| 2005/0254541 A1 * | 11/2005 | Okuda | 372/96 |
| 2007/0195847 A1 * | 8/2007 | Fukamachi et al. | 372/46.01 |

OTHER PUBLICATIONS

Schiaparelli, Via G.; Low-cost 10 Gb/s 1310nm uncooled electroabsorption modulated lasers; Italy.
C. Coriasso, et al., Low-cost 10 Gb/s 1310nm uncooled electroabsorption modulated lasers, ECOC, Sep. 24-28, 2006, Cannes, France Paper We 1.6.7.

* cited by examiner

Primary Examiner—Minsun Harvey
Assistant Examiner—Phillip Nguyen

(57) ABSTRACT

A photonic semiconductor device and method are provided that ensure that the surface of the device upon completion of the SAG process is planar, or at least substantially planar, such that performance of the subsequent processes is facilitated, thereby enabling higher manufacturing yield to be achieved. A photonic semiconductor device and method are also provided that ensure that the isolation region of the device will have high resistance and low capacitance, without requiring the placement of a thick dielectric material beneath each of the contact pads. Eliminating the need to place thick dielectric materials underneath the contact pads eliminates the risk that the contact pads will peel away from the assembly.

19 Claims, 11 Drawing Sheets

INTEGRATED PHOTONIC SEMICONDUCTOR DEVICES AND METHODS FOR MAKING INTEGRATED PHOTONIC SEMICONDUCTORS DEVICES

TECHNICAL FIELD OF THE INVENTION

The invention relates to integrated photonic semiconductor devices and methods for making such devices. More particularly, the invention relates to integrated photonic semiconductor devices such as an electroabsorption modulator (EAM) integrated with a distributed feedback laser (DFB) having improved performance at high speeds and improved manufacturing yield.

BACKGROUND OF THE INVENTION

An electroabsorption modulator (EAM) is a photonic semiconductor device that allows the intensity of a laser beam traveling through it to be controlled via an electric voltage. The principle of operation of the modulator is based on applying an electric field to cause a shift of the material absorption threshold toward longer wavelengths. A laser beam with a wavelength longer than that of the absorption threshold will either be transmitted without applied electric field or absorbed by applied electric field. A typical EAM has a waveguide structure and electrodes for applying an electric field in a direction that is perpendicular to the modulated light beam. In order to achieve a high extinction ratio, EAMs typically include a quantum well structure in the core of the waveguide. Due to the Quantum-Confined Stark Effect (QCSE), the quantum-well structure provides a strong shift of the absorption threshold at low electric fields. EAMs based on QCSE are capable of operating at relatively low voltages and at very high speeds (e.g., gigahertz (GHz)), which makes them suitable for use in optical communications systems.

A distributed feedback laser (DFB) is a laser in which the entire cavity is made up of a periodic refractive-index structure that functions as a distributed reflector at the lasing wavelength, and contains a gain medium. An EAM can be monolithically integrated with a DFB on a single chip to form an electroabsorption modulated distributed feedback laser (EML) device that is capable of operating as a data transmitter. EML devices have been proposed that operate at high data rates (e.g., 10 gigabit per second (Gb/s)) in the 1550 nanometer (nm) and 1310 nm ranges. There are many difficulties that must be overcome in order to manufacture large volumes of these devices with high yield.

FIG. 1 illustrates a cross-sectional top view of a known EML device 2 comprising a DFB 3 and an EAM 4. The DFB 3 and the EAM 4 each have metallic contact pads 5 and 6, respectively. One end facet 7 of the EML device 2 comprises a highly-reflective (HR) or anti-reflective (AR) coating. The other end facet 8 of the EML device 2 comprises an AR coating. An inter-contact isolation region 9 electrically isolates the DFB 3 and the EAM 4 from each other. The lines labeled 11A and 11B represent a straight reverse-mesa ridge structure 11 that extends across the DFB 3, the isolation region 9, and the EAM 4. The lines 13A and 13B delineate the channels located on either side of the ridge waveguide structure 11, which are created when the ridge waveguide structure 11 is formed.

The EML device 2 has trenches 12A and 12B formed therein to remove defect areas that exist after a surface area growth (SAG) process has been used to grow a multiple quantum well (MQW) structure, as described below in more detail with reference to FIG. 2A. The trenches 12A and 12B are generally uniform in width through the DFB 3, the EAM 4, and the isolation region 9. The trenches 12A and 12B are generally in parallel with and run alongside the reverse-mesa ridge structure 11.

FIG. 2A illustrates a cross-sectional view of the EML device 2 shown in FIG. 1 along the A-A' cross-section shown in FIG. 1. The different semiconductor layers that make up the EML device 2 are as follows. An n-type (001) Indium Phosphide (InP) material 21 is used as the substrate for the assembly 2. The substrate 21 has an n-type InP buffer layer 22 formed thereon. A MQW active region 23 is grown on top of the buffer layer 22 by a process known as Selective Area Growth (SAG). A p-type InP spacer layer 25 is grown on top of the MQW layer 23. A p-type Indium Gallium Arsenide Phosphide (InGaAsP) etch-stop layer 26 is grown on top of the spacer layer 25. Another p-type InP spacer layer 27 is grown on top of the InGaAsP etch-stop layer 26. A p-type InGaAsP grating layer 28 is grown on top of the spacer layer 27. A grating layer 28 is selectively etched in the DFB portion 3 to form a periodically varying refractive index region 31, which provides a filter for the laser spectrum in a desired wavelength value. A p-type InP infill 29 and cladding layer 32 are re-grown on top of layer 28. A p-type InGaAs contact layer 33 is then grown on top of the cladding layer 32.

FIG. 2B illustrates a cross-sectional view of the DFB portion 3 of the EML device 2 along the E-E' cross-section shown in FIG. 2A. After the contact layer 33 is grown, a silicon oxide (SiO$_2$) dielectric mask 34 represented by mask portions 34A, 34B and 34C is deposited on the top of the contact layer 33 and a wet chemical etch process is performed to etch the contact layer 33 and the cladding and infill layers 32 and 29.

FIG. 3 illustrates an enlarged view of the DFB portion 3 of the EML device 2 along the E-E' cross-section shown in FIG. 2A after the chemical etching process has been performed. When the chemical etch process is performed, the device 2 etches relatively quickly in the (001) plane, but relatively slowly in the (111) plane, causing the waveguide ridge 35 to be formed with lateral (111) facets 36 thereon, having an angle, ω, between the (001) and (111) facets that is typically about 54.7 degrees. This ridge configuration is commonly referred to as a reverse-mesa ridge configuration due to the fact that the top of the ridge is wider than the base of the ridge.

FIG. 4A illustrates a cross-sectional view of the DFB 3 shown in FIG. 2A along the E-E' cross-section prior to the layers of the MQW active region being grown using the SAG process. Prior to performing the SAG process to grow the MQW active region, a dielectric mask pattern comprising a plurality of rectangular mask portions 54A and 54B are deposited on top of the substrate 21, leaving openings 22 in which to grow the MQW active region.

FIG. 4B illustrates a cross-sectional view of the DFB 3 along the E-E' cross-section shown in FIG. 2A after the layers making up the MQW active region 23 have been grown. The layers 23 are grown only on the areas of the surface of the substrate 21 that are exposed through the mask pattern 54A and 54B.

FIG. 4C illustrates a cross-sectional view of the EAM 2 along the E-E' cross-section shown in FIG. 2A after the mask pattern 54A and 54B has been removed. After the mask pattern 54 has been removed, it can be seen that the surface is essentially non-planar. This non-planar surface is difficult to work with in performing the additional processes described above with reference to FIGS. 2A and 2B, e.g., growing the p-type InP spacer layer 25 on top of the MQW layer 23, growing the p-type InGaAsP etch-stop layer 26 on top of the spacer layer 25, growing the p-type InP spacer layer 27 on top of the InGaAsP etch-stop layer 26, growing the p-type InGaAsP grating layer 28 on top of the spacer layer 27, forming the periodically varying refractive index region 31 in the grating layer 28, etc., up through and including the formation of the reverse-mesa ridge structure 35. Because of the difficulties of working with the non-planar surface that results after the SAG process has been performed, the resulting assemblies may have performance problems, which will typically result in reduced manufacturing yield and increased costs.

With reference again to FIG. 1, it is important for the isolation region 9 between the DFB 3 and the EAM 4 to have high resistance and low capacitance. One technique that is used to provide the isolation region 9 with high resistance is to perform ion implantation in order to implant ions in the isolation region 9 to increase its resistance. One disadvantage of this technique is that it increases process complexity, which increases costs. Another disadvantage of this technique is that it is not always effective at providing the isolation region 9 with a sufficiently high resistance, which can lead to performance problems, and consequently, to reduced yield and increased costs.

A technique that is sometimes used to provide the isolation region 9 with decreased capacitance involves depositing a thick dielectric material underneath the contact pads 5 and 6. One disadvantage of this technique is that it increases process complexity, which increases costs. Another disadvantage of this technique is that it sometimes results in the contact pads 5 and 6 failing to adhere to the EML device 2. In other words, the pads 5 and 6 can peel away from the assembly 2, resulting in performance problems, and consequently, in reduced yield and increased costs.

Accordingly, a need exists for a photonic semiconductor device, such as an EML device of the type described above, for example, that is capable of operating at high speeds (e.g., 10 GB/s) over a wide temperature range in the 1310 and 1550 nm windows. A need also exists for a method for manufacturing such a device in such a way that manufacturing yield is kept relatively high and costs are kept relatively low.

SUMMARY OF THE INVENTION

The invention provides a photonic semiconductor device and methods for making a photonic semiconductor device. In accordance with one embodiment, the photonic semiconductor device comprises a substrate, one or more layers, a waveguide ridge, a first trench, and a second trench. The one or more layers of the semiconductor device include at least one buffer layer having a lower surface that is in contact with an upper surface of the substrate, one or more MQW and SCH layers, at least one grating layer having a lower surface that is in contact with an upper surface of an uppermost one of the MQW and SCH layers, and one or more cladding and contact layers having a lower surface that is in contact with an upper surface of the grating layer. The waveguide ridge is formed in the cladding and contact layers. The first trench is formed at least in the contact and cladding layers and the grating layer. The first trench is located on one side of the waveguide ridge and extends in a direction substantially parallel to the waveguide ridge alongside it. The first trench has at least a first width along a first portion thereof and a second width along a second portion thereof, the second width being greater than the first width. The second trench is formed at least in the contact and cladding layers and the grating layer. The second trench is located on a side of the waveguide ridge opposite the side of the waveguide ridge on which the first trench is located. The second trench extends in a direction substantially parallel to the waveguide ridge alongside the waveguide ridge. The second trench has at least a first width along a first portion thereof and a second width along a second portion thereof, the second width being greater than the first width.

The method, in accordance with an embodiment, comprises providing a substrate, forming one or more layers on the substrate, forming a waveguide ridge in one or more of the layers, and forming first and second trenches in one or more of the layers. The one or more layers include at least one buffer layer, one or more MQW and SCH layers, at least one grating layer, and one or more cladding and contact layers. The waveguide ridge is formed in the cladding and contact layers. The first trench is formed at least in the contact and cladding layers and the grating layer. The first trench is located on a side of the waveguide ridge and extends in a direction substantially parallel to the waveguide ridge alongside it. The first trench has at least a first width along a first portion thereof and a second width along a second portion thereof, the second width being greater than the first width. The second trench is formed at least in the contact and cladding layers and the grating layer. The second trench is located on a side of the waveguide ridge opposite the side of the waveguide ridge on which the first trench is located. The second trench extends in a direction substantially parallel to the waveguide ridge alongside the waveguide ridge. The second trench has at least a first width along a first portion thereof and a second width along a second portion thereof, the second width being greater than the first width.

In accordance with another embodiment, the photonic semiconductor device comprises a substrate, one or more layers including at least one buffer layer, one or more MQW and SCH layers, a grating layer, one or more stop etch and spacer layers, a waveguide ridge formed on the grating layer, a first mini-trench formed, and a second mini-trench. The first mini-trench is formed at least in the grating layer and at least partially in the stop etch and spacer layers in a first channel on a first side of the waveguide ridge. The first mini-trench extends in a direction substantially parallel to the waveguide ridge alongside the waveguide ridge in the first channel. The second mini-trench is formed at least in the grating layer and at least partially in the stop etch and spacer layers in a second channel on a second side of the waveguide ridge. The second mini-trench extends in a direction substantially parallel to the waveguide ridge alongside the waveguide ridge. Thus, the first and second mini-trenches are formed in the channels on opposite sides of the waveguide ridge. The first and second mini-trenches provide an isolation region of the semiconductor device with a relatively high resistance and a relatively low parasitic capacitance.

The method, in accordance with another embodiment, is a method for performing a SAG process when making a photonic semiconductor device in a way that results in a substantially planar surface at the completion of the SAG process. The method comprises providing a substrate, forming at least a first layer structure on the substrate having at least first and second layers, forming a mask pattern on the upper surface of the second layer such that at least one portion of the second layer is unmasked and at least one portion of the second layer is masked, performing an etching process that etches away unmasked portions of the second layer to form at least one recess in the second layer, and performing a SAG process to form at least a second layer structure of the photonic semiconductor device. The second layer structure comprises at least one MQW layer and at least one SCH layer. The second layer structure has a lower surface that is in contact with the upper surface of the first layer, and the upper surface of the second layer structure is substantially coplanar with the upper surface of the first layer structure.

The method, in accordance with another embodiment, is a method for adhering a contact pad to a surface of a semiconductor device. The method comprises providing a substrate having an upper surface and a lower surface, forming at least one trench in the substrate, forming a contact pad on the substrate such that a portion of the contact pad is disposed on the upper surface of the substrate and a portion of the contact pad is disposed within the trench and is in contact with at least one of the sides of the trench. The portion of the contact pad that is disposed within the trench and in contact with at least one of the sides of the trench forms an anchor for the pad that helps adhere the contact pad to the substrate.

These and other features and advantages of the invention will become apparent from the following description, drawings and claims.

DETAILED DESCRIPTION OF ILLUSTRATIVE EMBODIMENTS

The invention provides a method for forming a photonic semiconductor device in a way that ensures that the surface of the device in the (001) crystallographic orientation upon completion of the SAG process is planar, or at least substantially planar, such that performance of the subsequent processes is facilitated, thereby enabling higher manufacturing yield to be achieved. The invention also provides a method for manufacturing an EML device in a way that ensures that the isolation region of the assembly will have high resistance and low capacitance, without requiring the placement of a thick dielectric material beneath each of the contact pads. As stated above, placing thick dielectric materials underneath the contact pads can result in the pads peeling away from the assembly, which can adversely affect performance, reduce yield and increase costs. Therefore, eliminating the need to place thick dielectric materials underneath the contact pads eliminates the risk that the contact pads will peel away from the assembly.

Figure 4A:
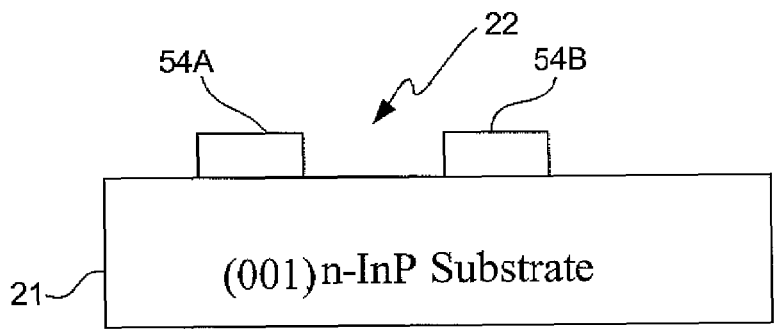
FIG. 4A illustrates a cross-sectional view of the DFB shown in FIG. 2A along the E-E' cross-section shown in FIG. 2A prior to the MQW layer being grown.
Figure 4B:
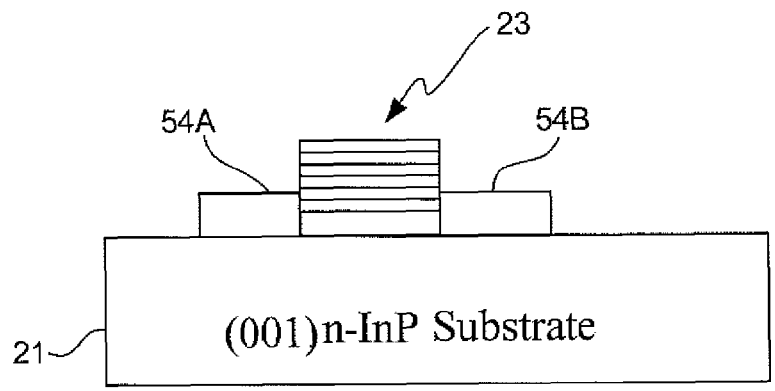
FIG. 4B illustrates a cross-sectional view of the EAM shown in FIG. 2A along the E-E' cross-section shown in FIG. 2A after the MQW layer has been grown.
Figure 4C:
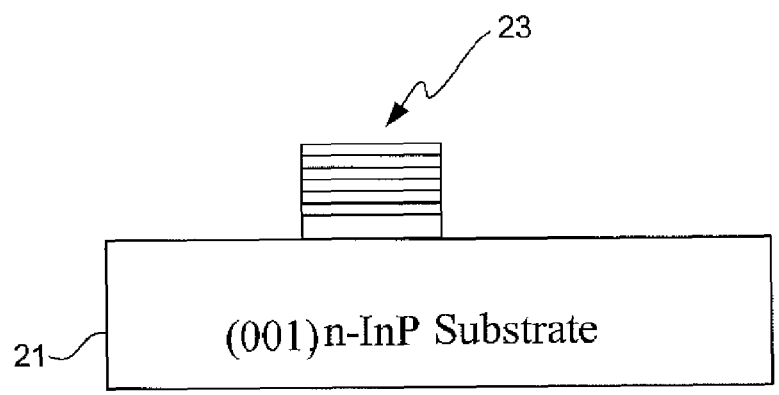
FIG. 4C illustrates a cross-sectional view of the EAM shown in FIG. 2A along the E-E' cross-section shown in FIG. 2A after the mask pattern shown in FIGS. 4A and 4B has been removed.

FIGS. 5A-5D illustrate cross-sectional views of a photonic semiconductor device 100, which may be, for example, an EML device, in accordance with an embodiment of the invention. In accordance with this embodiment, a pre-SAG process is performed prior to performing the known SAG process that is typically used to create the MQW active region. The term "pre-SAG process", as that term is used herein, is intended to denote a process that is performed as a precursor to performing the SAG process that ensures that the top surface of the device 100 in the (001) crystallographic orientation is planar, or at least substantially planar, at the completion of the SAG process. Performing the pre-SAG process ensures that the surface of the device at the completion of the SAG process is planar, or at least substantially planar, in contrast to the nonplanar surface that results at the completion of the known SAG process shown in FIGS. 4B and 4C.

Figure 5A:
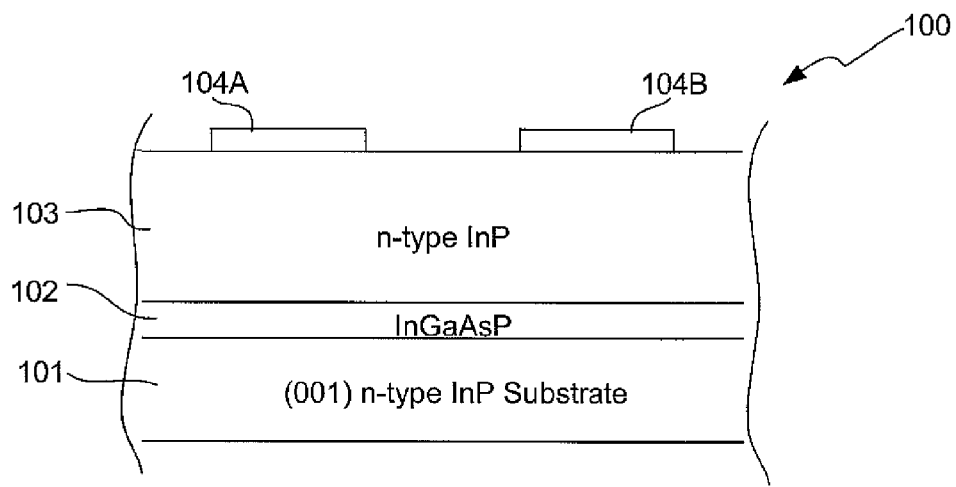
FIGS. 5A-5D illustrate cross-sectional views of a photonic semiconductor device in accordance with an embodiment of the invention, which may be, for example, an EML device, and demonstrate the manner in which the pre-SAG process of the invention is performed prior to performing the known SAG process.
Figure 5B:
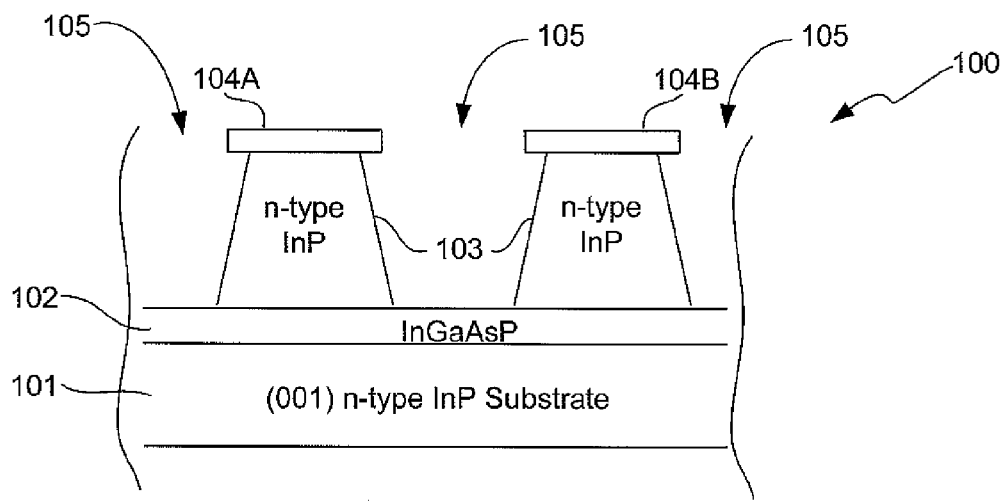
Figure 5C:
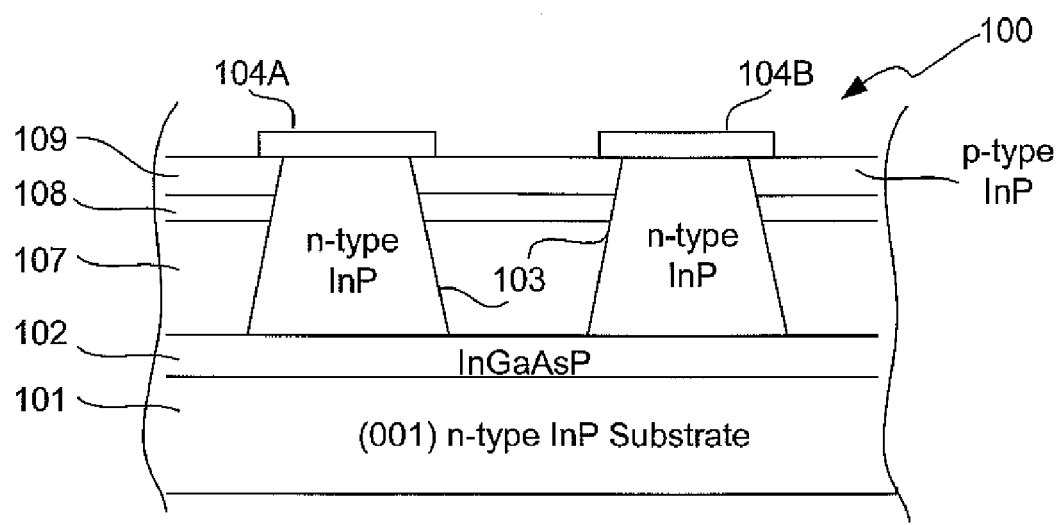

With reference to FIG. 5A, a planar InGaAsP stop-etch layer 102 is grown on an (001)-oriented n-type InP substrate 101. An n-type InP layer 103 is then grown on top of the InGaAsP stop-etch layer 102. With reference to FIG. 5B, a selective InP etch solution is then used to etch the InP layer 103 down to the stop-etch layer 102. The mask portions 104A and 104B are resistant to the chemical etch, and therefore prevent the masked areas of the InP layer 103 from being etched. The result of the etching process (FIG. 5B) is a plurality of recesses 105 formed in the InP layer 103. With reference to FIG. 5C, with the mask portions 104A and 104B remaining in place, the known SAG process is then used to grow: (1) a layer of n-type InP 107 over the unmasked surfaces of the InGaAsP layer 102, (2) one or more layers that define the MQW active region and separate confinement heterostructure 108, and (3) a layer 109 of p-type InP.

Figure 2A:
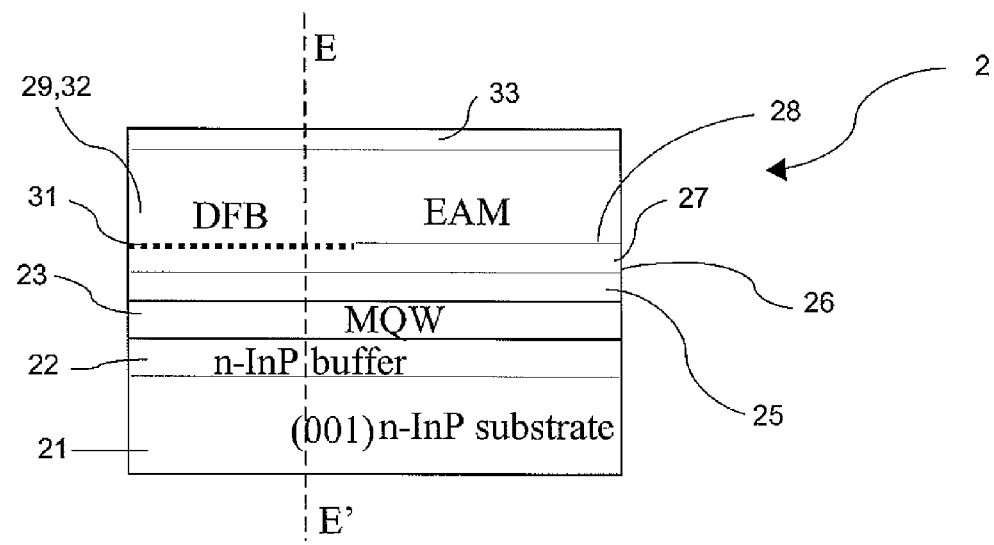
FIG. 2A illustrates a cross-sectional view of the EML device shown in FIG. 1 along the A-A' cross-section shown in FIG. 1.
Figure 2B:
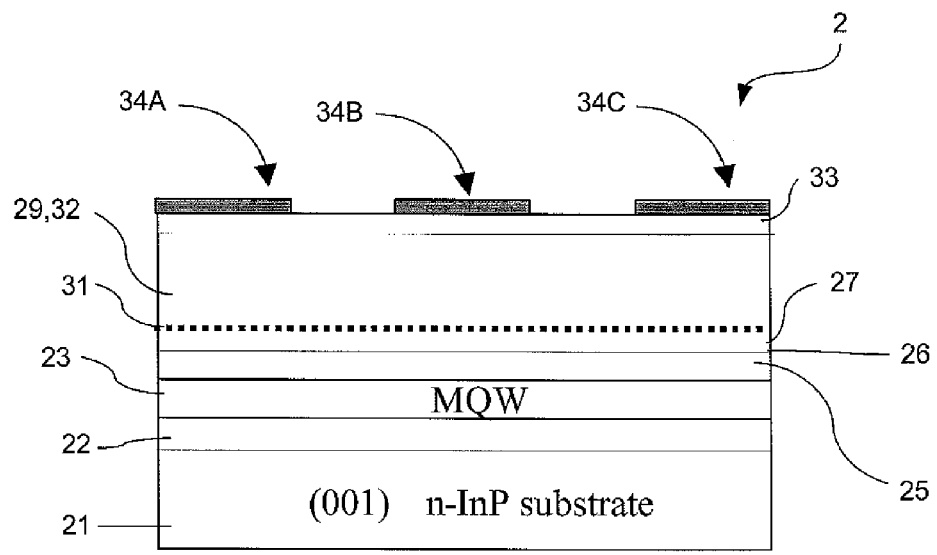
FIG. 2B illustrates a cross-sectional view of the DFB portion of the EML device shown in FIG. 1 along the E-E' cross-section shown in FIG. 2A, with SiO2 stripes deposited thereon.
Figure 3:
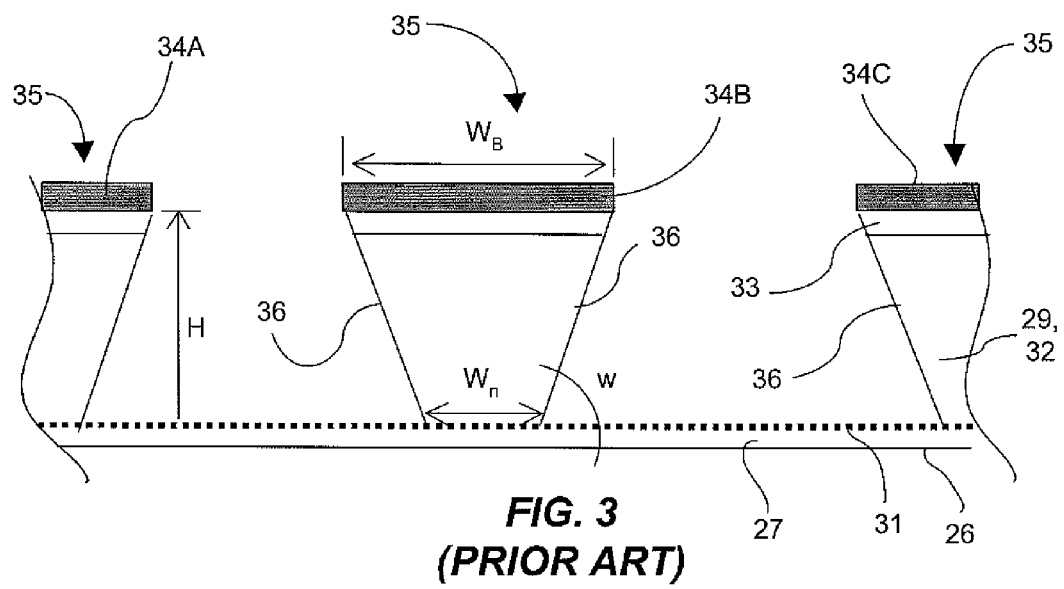
FIG. 3 illustrates an enlarged view of the DFB portion of the EML device shown in FIGS. 2A and 2B along the E-E' cross-section shown in FIG. 2A after the chemical etching process has been performed.
Figure 5D:
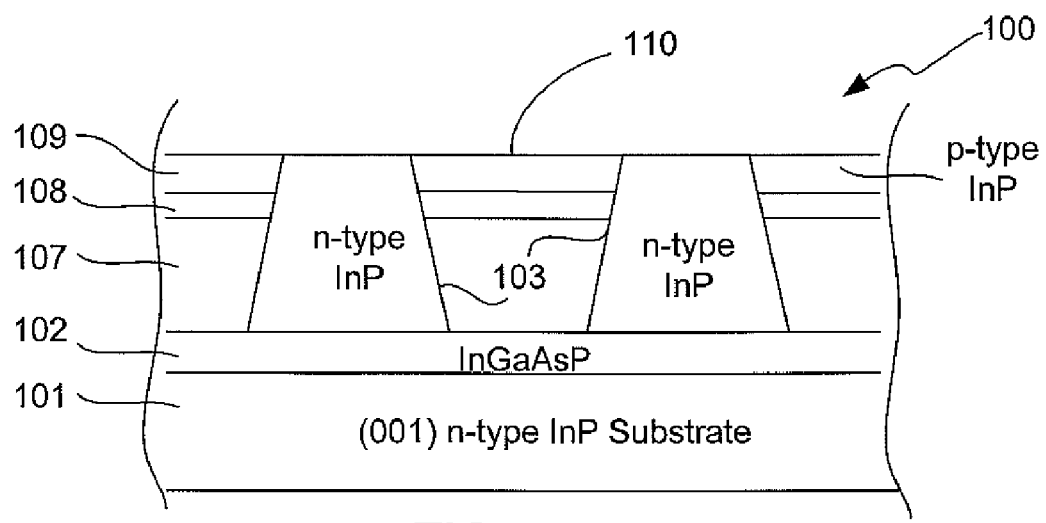

With reference to FIG. 5D, after the SAG process has been performed, the mask portions 104A and 104B are removed, leaving a planar, or at least substantially planar, surface 110 of alternating n-type InP and p-type InP. This surface 110 is much easier to work with when performing the subsequent processing steps described above with reference to FIGS. 2A-3 to put down the additional layers 26, 27, 29, 32, 33, form the grating 31, put down the mask 34, form the ridges 35, etc. The overall result is a great improvement in manufacturing yield, performance benefits and decreased costs.

Figure 1:
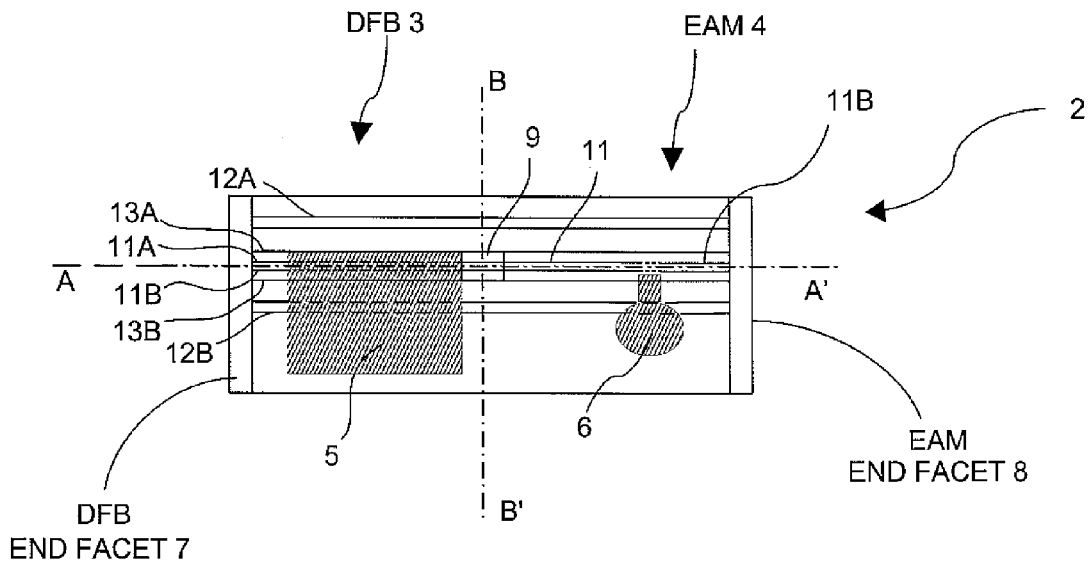
FIG. 1 illustrates a cross-sectional top view of a known EML device 2 comprising a DFB 3 and an EAM 4.

The pre-SAG process described above with reference to FIGS. 5A-5D may be used as part of the overall process for creating an EML device, such as that described above with reference to FIG. 1, and may also be used as part of the overall process for creating other integrated photonic devices. For example, the pre-SAG process may be used in a process during which a DFB is integrated with a passive waveguide in a semiconductor device (not shown) or in a process during which a passive waveguide is integrated with an amplifier in a semiconductor device (not shown). Also, although the pre-SAG process has been described with reference to particular processing steps and materials, modifications may be made to the steps and materials used in the pre-SAG process.

Figure 6A:
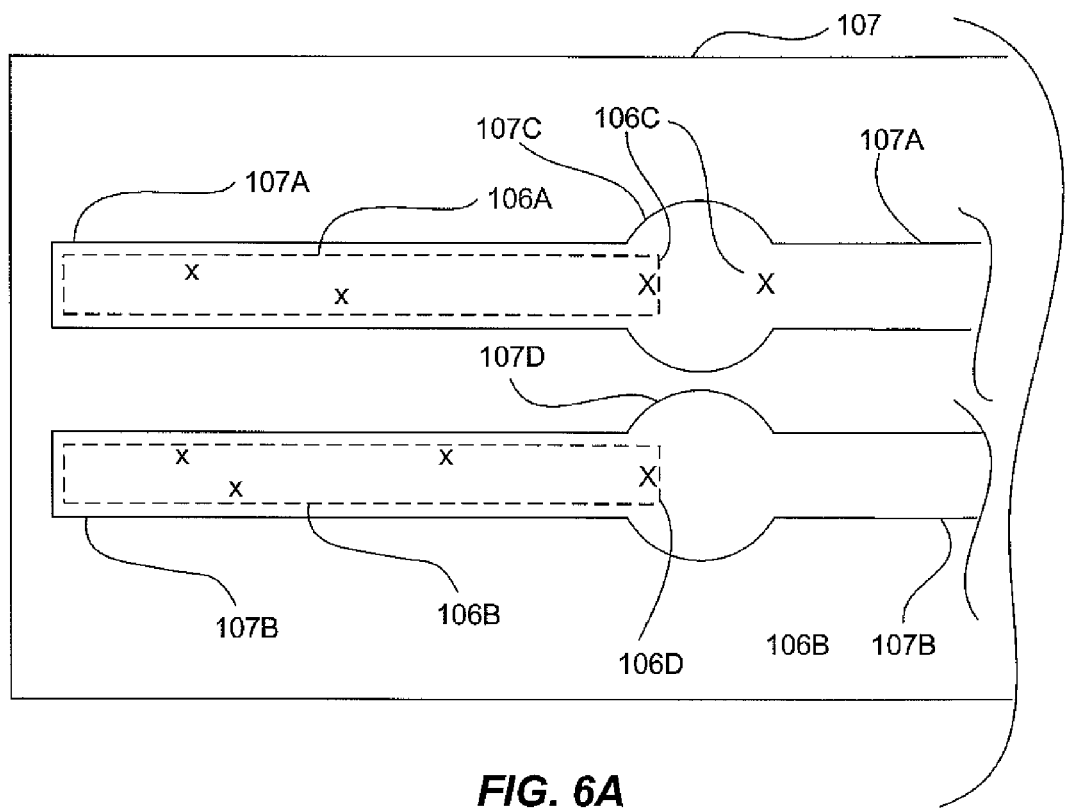
FIG. 6A illustrates a top view of the surface shown in FIG. 5D after the mask portions shown in FIG. 5D have been removed and a new mask has been deposited in preparation for forming deep trenches in the unmasked regions.

FIG. 6A illustrates a top view of the surface 110 shown in FIG. 5D after the mask portions 104A and 104B have been removed. The locations where the mask portions 104A and 104B have been removed are represented in FIG. 6A by the rectangular boxes labeled 106A and 106B, respectively. The mask portions 104A and 104B are typically removed by performing a wet chemical etching process suitable for removing dielectric mask material. When the mask portions 104A and 104B are removed, some defects typically remain on the surface 110 at locations where the edge of the mask portions were in contact with the surface 110 before being removed and on the areas between the lateral walls of the InP layer 103 that form the recess 105 and the SAG regrown material. These defects are represented in FIG. 6A by lower case "x"'s and by upper case "X"'s. The lower case x's represent smaller defects along the mask edges whereas the upper case X's represent larger defects around the terminal end of the mask, i.e., at the transition region between the DFB and the EAM. In order to remove these larger defects, a second mask 107, which is typically also a dielectric mask made of, for example, $SiO_2$, is placed on the surface 110 to cover generally all of the surface 110 except for the areas represented by the straight regions 107A and 107B of the mask 107 and the enlarged regions 107C and 107D of the mask 107. The mask 107 has openings 107A and 107B formed therein that are typically slightly larger than the areas 106A and 106B, respectively. In additional, at the terminal ends 106C and 106D of the areas 106A and 106B, the mask openings 107C and 107D, respectively, are slightly enlarged.

Figure 6B:
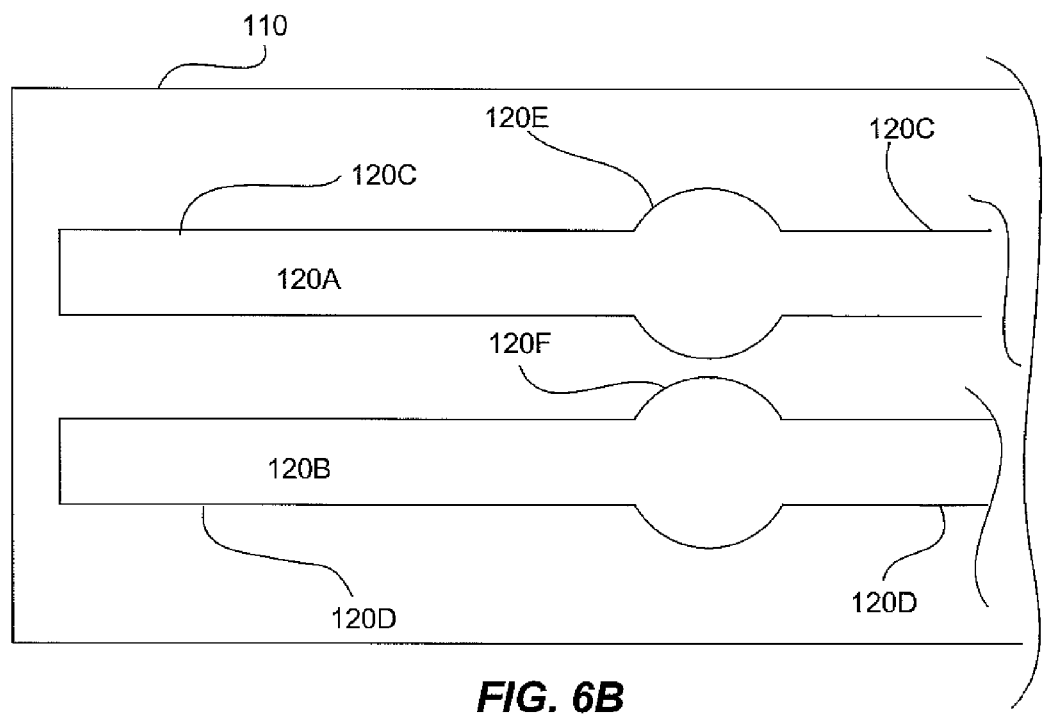
FIG. 6B illustrates a top view of the surface shown in 6A having trenches formed therein.

After the mask 107 has been put in place with the openings 107A and 107B aligned with the areas 106A and 106B, respectively, a wet chemical etching process is performed to etch away the area within the mask openings 107A-107D, forming trenches 120A and 120B, respectively, in the surface 110. FIG. 6B illustrates a top view of the surface 110 having the trenches 120A and 120B formed therein. The trench 120A has a uniform trench portion 120C and a non-uniform trench portion 120E. Likewise, the trench 120B has a uniform trench portion 120D and a non-uniform trench portion 120F. The configurations of the trenches 120A and 120B ensure that all of the defects are removed. If the trenches were made to be uniform along their entire widths, it would be possible to remove all of the defects represented by the x's along the mask edges, but it might not be possible to remove all of the defects near the transition region between the DFB and the EAM. The result would be that the remaining defects represented by the X's might diffuse during the successive cladding growth, resulting in the defective area becoming significantly enlarged. If uniform trenches were made that were deeper and wider, this might make it possible to remove both the x and X defects. However, because the distance between the two trenches is a fundamental factor for single-mode lasing behavior, increasing the widths of the trenches uniformly could adversely affect single-mode laser performance. Also, increasing the widths and depths of the trenches would mean that the etching time during which the trenches are formed would also be increased. The trenches 120A and 120B shown in FIG. 6B do not have increased widths along the uniform portions 120C and 120D, respectively, but do have increased widths at the non-uniform trench portions 120E and 120F, respectively. This trench configuration ensures that all defects are removed without potentially adversely affecting performance and without increasing the etching time.

Figure 7:
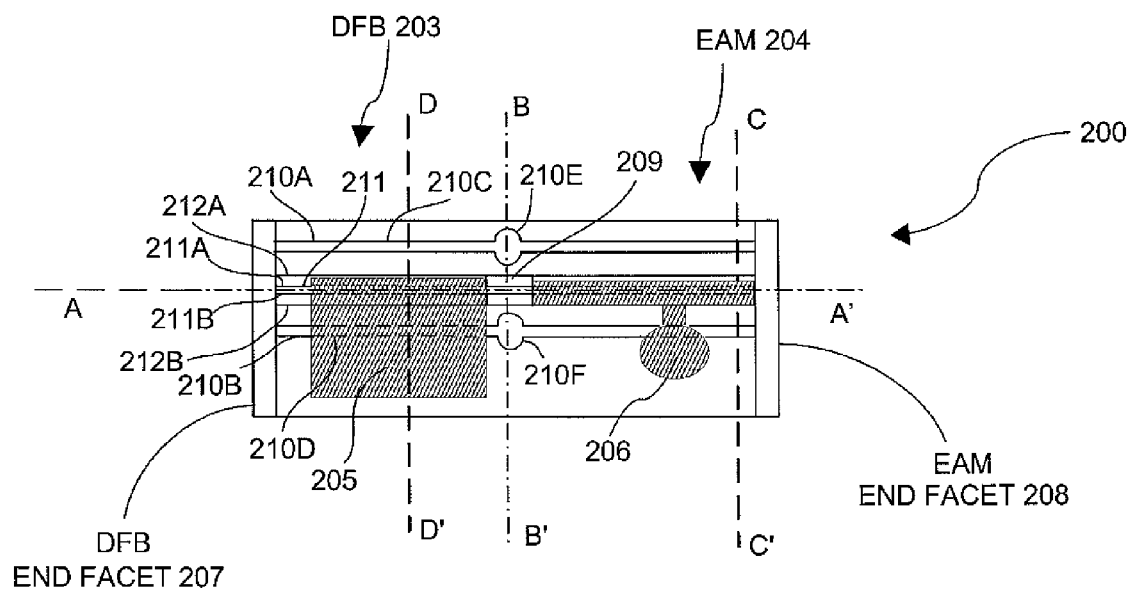
FIG. 7 illustrates a cross-sectional top view of an EML device in accordance with an embodiment comprising a DFB and an EAM having the trenches shown in FIG. 6B formed therein.

FIG. 7 illustrates a cross-sectional top view of an EML device 200 in accordance with an embodiment comprising a DFB 203 and an EAM 204. The DFB 203 and the EAM 204 each have metallic contact pads 205 and 206, respectively. One end facet 207 of the EML device 200 comprises a highly-reflective (HR) or anti-reflective (AR) coating. The other end facet 208 of the EML device 202 comprises an AR coating. An inter-contact isolation region 209 electrically isolates the DFB 203 and the EAM 204 from each other. The lines labeled 211A and 211B delineate a straight, reverse-mesa ridge waveguide structure 211 that extends from end facet 207 to end facet 208. The lines 212A and 212B on either side of the waveguide structure 211 delineate the channels that run on either side of the waveguide structure 211 in parallel therewith. The channels are created by the formation of the waveguide structure 211.

The EML device 200 has trenches 210A and 210B formed therein that are of the type described above with reference to FIG. 6B. The trenches 210A and 210B have uniform trench portions 210C and 210D, respectively, and non-uniform trench portions 210E and 210F, respectively. The trenches 210A and 210B are in parallel with and run alongside the reverse-mesa ridge structure 211. The reverse-mesa ridge structure may be formed in the manner described above with reference to FIG. 3, except that the pre-SAG process of the invention described above with reference to FIGS. 5A-5D is preferably used in creating the assembly as opposed to the process described above with reference to FIGS. 4A-4C being used to create the assembly.

The trenches 210A and 210B are typically deep formed by etching through the contact layer and all of the grown layers (e.g., the cladding layers, the MQW layers, the stop etch layers, the buffer layer) down to the top surface of the substrate. However, the etching process may stop part way through the buffer layer before reaching the substrate surface. The trenches 210A and 210B are formed at least in the contact and cladding layers and in the grating layer. The invention is not limited with respect to which layers of the device are etched through to form the trenches 210A and 210B. The invention also is not limited with respect to the process that is used to form the trenches. Wet chemical etching is only one suitable process that may be used to form the trenches.

Figure 8:
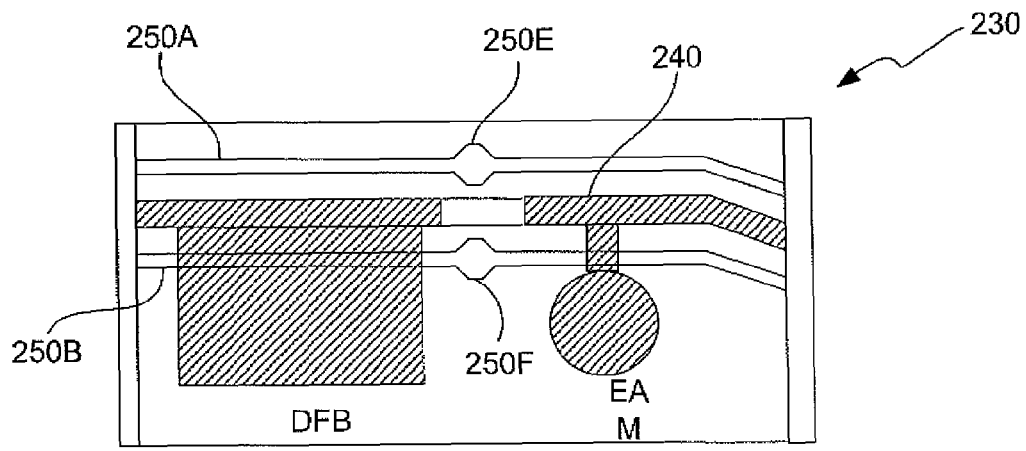
FIG. 8 illustrates an alternative embodiment of an EML device in accordance with an embodiment having a bent reverse-mesa ridge structure and the trenches of the type shown in FIG. 6B that are bent formed therein.
Figure 9:
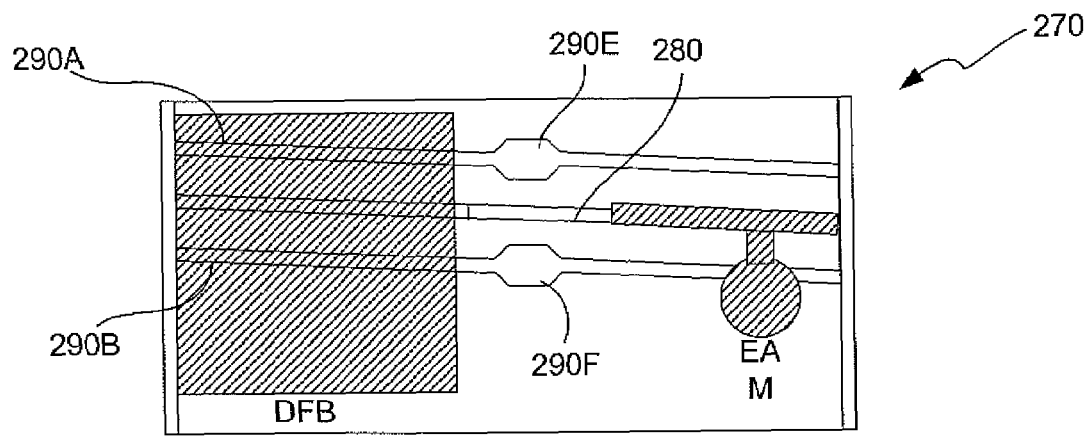
FIG. 9 illustrates yet an alternative embodiment of an EML device in accordance with an embodiment having a tilted reverse-mesa ridge structure and trenches of the type shown in FIGS. 6B that are tilted.

Also, it is not necessary for the ridge structure to be straight. FIG. 8 illustrates an alternative embodiment of an EML device 230 in accordance with an embodiment, wherein both the reverse-mesa ridge structure 240 and the trenches 250A and 250B are bent. FIG. 9 illustrates yet an alternative embodiment of an EML device 270 in accordance with an embodiment, wherein both the reverse-mesa ridge structure 280 and the trenches 290A and 290B are tilted. As with the EML device 200 shown in FIG. 7, the EML assemblies 230 and 270 shown in FIGS. 8 and 9 also have non-uniform, i.e., enlarged, trench portions 250E and 250F and 290E and 290F in the transition region between the DFBs and the EAMs, although the enlarged portions may be slightly different in shape due to the trenches being straight (FIG. 7), bent (FIG. 8) or tilted (FIG. 9).

As stated above, it is also a goal of the invention to provide the isolation region of an EML device, such as those shown in FIGS. 7-9, with high resistance and low capacitance. In accordance with an embodiment, this is accomplished by forming small, or mini-, trenches in the EAM and in the isolation region of the EML device by etching the residual upper cladding on each lateral channel of the reverse-mesa ridge structure. The manner in which this is accomplished will now be described with reference to FIGS. 10A-10C.

Figure 10A:
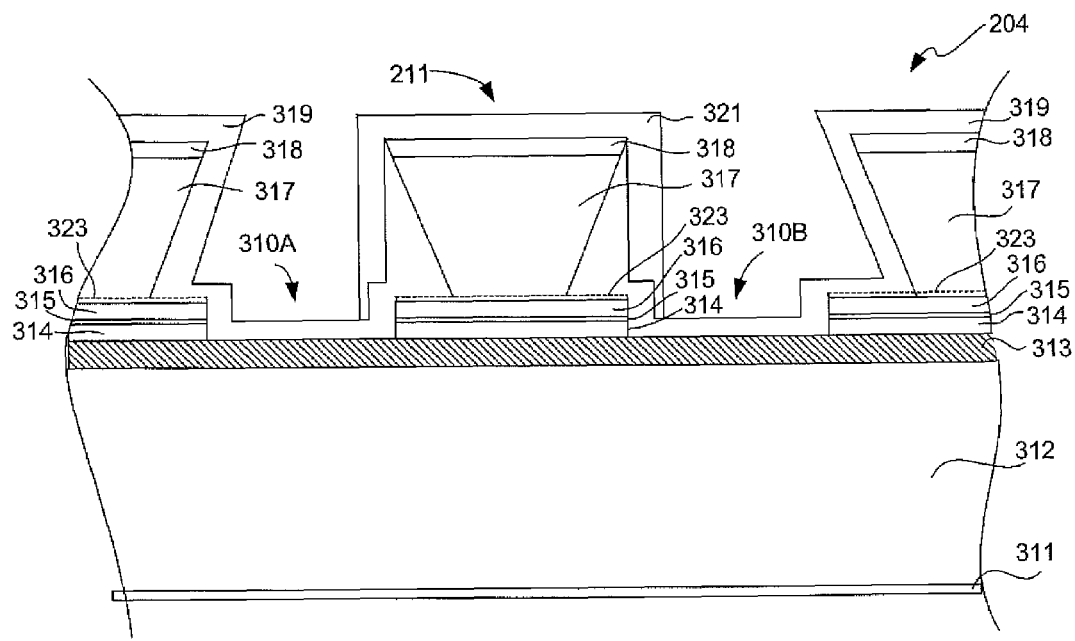
FIG. 10A illustrates a cross-sectional view of the EAM of the EML device shown in FIG. 7 along the C-C' cross section.
Figure 10B:
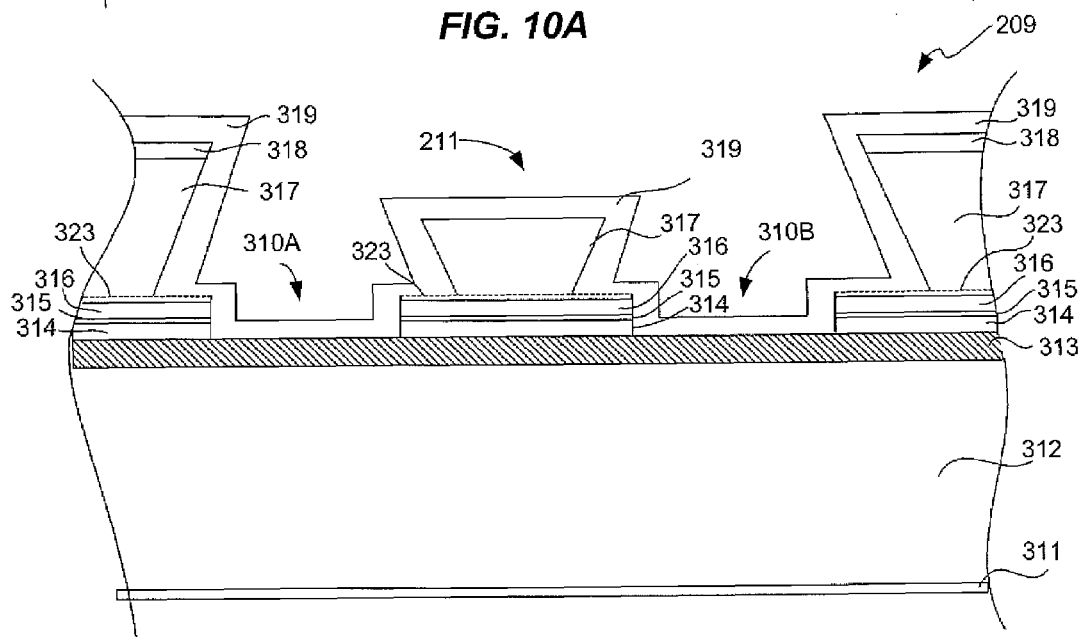
FIG. 10B illustrates a cross-sectional view of the isolation region of the EML assembly shown in FIG. 7 along the B-B' cross section.
Figure 10C:
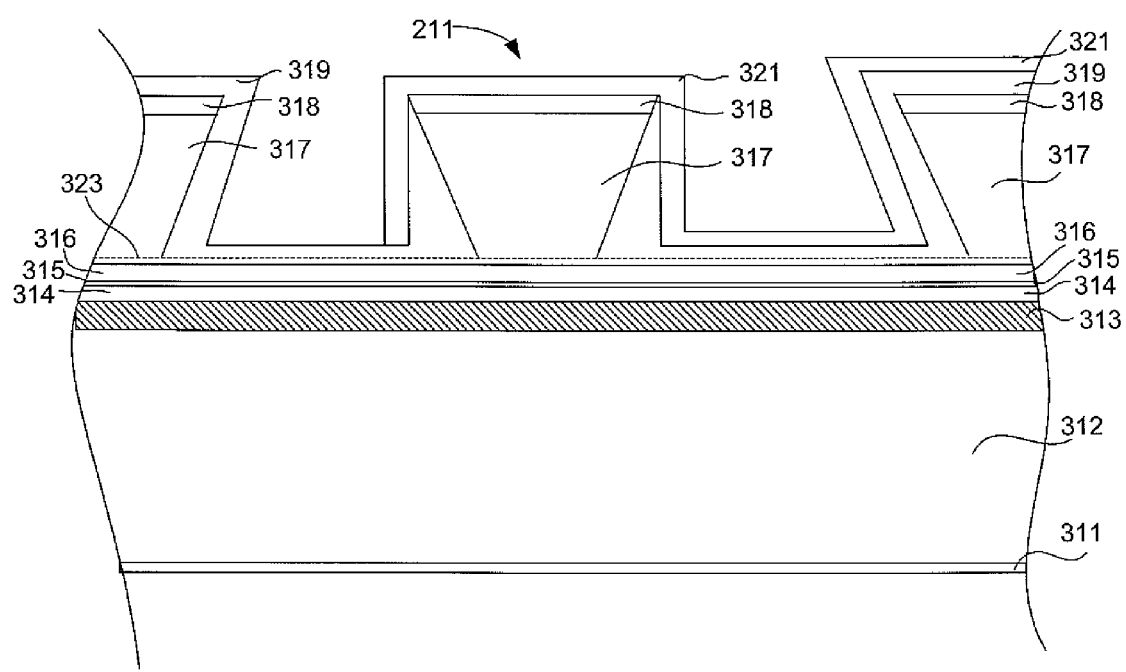
FIG. 10C illustrates a cross-sectional view of the DFB of the EML assembly shown in FIG. 7 along the D-D' cross section.

FIG. 10A illustrates a cross-sectional view of the EAM 204 of the EML device 200 shown in FIG. 7 along the C-C' cross section. FIG. 10B illustrates a cross-sectional view of the isolation region 209 of the ELM assembly 200 shown in FIG. 7 along the B-B' cross section. FIG. 10C illustrates a cross-sectional view of the DFB 203 of the ELM assembly 200 shown in FIG. 7 along the D-D' cross section. For ease of illustration, the cross sections shown in FIGS. 10A-10C do not include the trenches 210A and 210B shown in FIG. 7. Also, all of the layers that make up the EML device 200 are not shown in FIGS. 10A-10C for ease of illustration. The layers that are shown in FIGS. 10A-10C are as follows. Layer 311 corresponds to an n-type metal layer. Layer 312 corresponds to a layer of n-type InP. Layer 313 represents one or more layers that make up the MQW active region. Layer 314 corresponds to a first p-type InP spacer layer. Layer 315 corresponds to a p-type InGaAsP etch-stop layer. Layer 316 corresponds to a second p-doped InP spacer layer. Layer 323 corresponds to the grating layer. Layer 317 corresponds to a p-type InP cladding layer. Layer 318 corresponds to an InGaAs contact layer.

With reference now to FIG. 10A, after the reverse-mesa waveguide ridge structure 211 has been formed in the EML assembly 200 along its entire length, mini-trenches 310A and 310B are formed in the channels on each side of the ridge structure 211 by etching away portions of the grating layer 323 and the spacer and stop layers 314-316. A layer 319 of dielectric material is then deposited over the assembly 200 everywhere except over the portion of the InGaAs contact layer 318 covering the ridge structure 211. A layer of p-type metal 321 is then deposited over the ridge structure 211.

With reference to FIG. 10B, the portions of the grating layer 323 and the spacer and stop etch layers 314-316 are also etched in the isolation region 209 in the channels on each side of the ridge structure 211 to form the mini-trenches 310A and 310B. In the isolation region 209, the portion of the InGaAs contact layer 318 shown in FIG. 10A over the ridge structure 211 does not exist and the cladding layer 317 in the region of the ridge structure 211 has been partially removed. In addition, the p-type metal 321 shown covering the contact layer 318 and the ridge structure 211 in FIG. 10A also does not exist in the isolation region 209.

With reference to FIG. 10C, the DFB 203 does not include the mini-trenches 310A and 310B shown in FIGS. 10A and 10B. Thus, the grating layer 323 and the spacer and stop etch layers 314-316 are not etched in the DFB 203. In all other aspects, the portion of the DFB 203 shown in FIG. 10C is identical to the portion of the EAM portion 204 shown in FIG. 10A. The mini-trenches 310A and 310B preferably do not continue into the DFB portion 203 because allowing the mini-trenches 310A and 310B to continue through the DFB portion 203 would result in an undesired electro-optic effect, such as multi-mode emission, for example.

With reference again to FIGS. 10A and 10B, the removal of the portions of the grating layer 323 and the spacer and stop etch layers 314-316 when forming the mini-trenches 310A and 310B results in a reduction in the uppermost p-type contact area locally in the areas immediately surrounding the mini-trenches 310A and 310B. The result is a drastic reduction in the parasitic capacitance in the EAM 204. For example, the mini-trenches 310A and 310B may provide a parasitic capacitance that is less than about 0.5 Pico Farads (pF) for an EAM section that is about 150 micrometers (μm) in length in the direction of the ridge 211. In addition, the mini-trenches 310A and 310B also act to block lateral electrical spreading current, thus providing the isolation region 209 with a high resistance, e.g., in excess of 50 kilo-ohms (KΩ).

The larger trenches 210A and 210B shown in FIG. 7 may be, for example, several micrometers in width (e.g., 10 to 20 μm). The distance between the larger trenches 210A and 210B may be, for example, 20 μm, which will ensure single mode operation of the DFB 203. The mini-trenches 310A and 310B shown in FIGS. 10A-10C will have a width that is smaller than the width of the larger trenches 210A and 210B. The invention is not limited with respect to the widths or depths of the larger trenches 210A and 210B or of the mini-trenches 310A and 310B.

Because the mini-trenches 310A and 310B provide the isolation region 209 with a relatively low parasitic capacitance, it is unnecessary to place thick dielectric materials beneath the contact pads 205 and 206 (FIG. 7) in order to reduce the parasitic capacitance. In addition, in accordance with another embodiment of the invention, the contact pads 205 and 206 are anchored into the EML device 200 to ensure that they do not peel away from the surface of the EML device 200 on which they are placed, which is typically the dielectric layer 319 and the contact layer 318 in the EAM 204 and the upper cladding layer in the DFB 203. The manner in which this may be accomplished in accordance with an embodiment will now be described with reference to FIG. 11.

Figure 11:
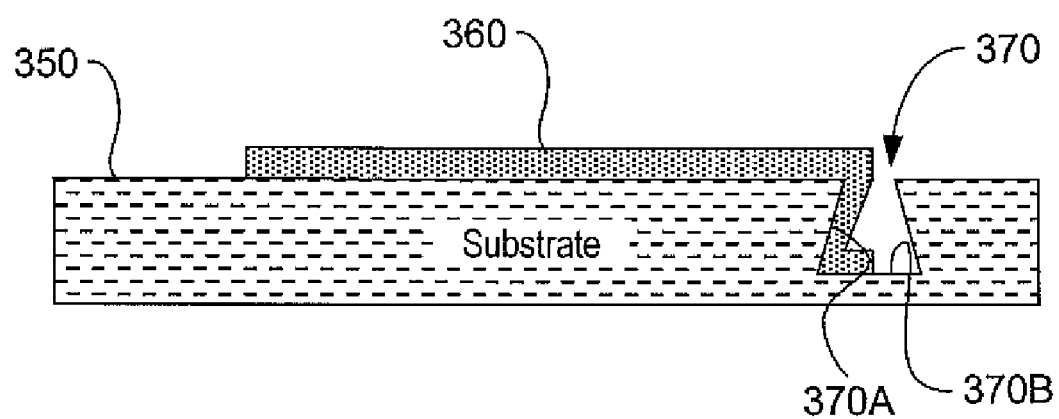
FIG. 11 illustrates a cross-sectional view of a substrate 350 having a metal contact pad 360 anchored thereto in accordance with an embodiment of the invention.

FIG. 11 illustrates a cross-sectional view of a substrate 350 having a metal contact pad 360 anchored thereto in accordance with an embodiment of the invention. The substrate 350 may be, for example, the substrate 101 shown in FIGS. 5A-5C. The metal contact pad 360 may be anchored into the substrate 350 or it may be anchored into one or more layers deposited on the substrate. For ease of illustration, the metal contact pad is shown in FIG. 11 anchored directly in the substrate 350. To anchor the pad 360, a trench 370 is formed in the substrate 350 by using a suitable mask (not shown) to mask off areas on the substrate 350 that are not to be etched, and then etching the unmasked area with a suitable etching material and process, such as a wet chemical etching material and process, for example. A dry etching process may instead be used for this purpose. The metal that is to be used to form the pad 360 is then deposited on the substrate 350 by using a suitable deposition process. When the metal is deposited, part of the metal will extend into the trench 370, preferably along a side wall 370A of the trench 370 and along a portion of the bottom surface 370B of the trench 370. The portion of the metal that extends into the trench 370 acts as an anchor that ensures that the pad 360 adheres to the substrate 350 and will not peel away from the substrate 350, thereby ensuring that performance and manufacturing yield will not adversely affected due to one or more of the pads peeling away from the substrate 350.

Although FIG. 11 illustrates the trench 370 having a particular shape that is similar to the shape of the channels formed on either side of the reverse-mesa ridge structure shown in, for example, FIG. 10B, the invention is not limited with respect to the shape of the trench 370. What is important is that the surface area within the trench 370 be sufficient to provide increased anchorage to prevent the metal pad 360 from peeling away, or detaching, from the device. Preferably, the trench 370 has a reentrant shape as shown in FIG. 11, but this is not critical to the invention.

It should be noted that the invention has been described in detail with reference to illustrative embodiments for the purposes of demonstrating the principles and concepts of the invention. For example, although the photonic semiconductor device has been described herein as an EML device, the invention applies equally to other types of phonic semiconductor devices, including, but not limited to, lasers, modulators, passive waveguides, photodetectors, and optical amplifiers. Also, although the semiconductor devices have been described herein with reference to particular materials (Aluminium-based materials, InP, InGaAs, etc.) and structural parameters (e.g., width, etc.), the invention is not limited to these materials or parameters, as will be understood by those skilled in the art in view of the description provided herein. In addition, the drawings described above are not to scale. Also, although the layers and edges shown in, for example, FIGS. 10A-10C are shown as being sharp and uniform thicknesses and shapes, this is typically not the case with layers that are grown and/or etched using semiconductor processing technologies. The drawings are shown this way for ease of illustration and discussion. Also, many modifications can be made to the embodiments described herein and all such modifications are within the scope of the invention.

What is claimed is:

1. A photonic semiconductor device comprising:
    a substrate having a lower surface and an upper surface;
    one or more layers including:
        at least one buffer layer having a lower surface that is in contact with the upper surface of the substrate;
        one or more multi quantum well (MQW) and confinement heterostructure (SCH) layers, one layer of said one or more MQW and SCH layers having a lower surface that is in contact with an upper surface of said at least one buffer layer;
        at least one grating layer having a lower surface that is in contact with an upper surface of said one or more MQW and SCH layers, at least a portion of the grating layer having a periodically varying refractive index region therein;
        one or more cladding and contact layers, one of said one or more cladding and contact layers having a lower surface that is in contact with an upper surface of said at least one grating layer;
        a waveguide ridge formed in at least said one or more cladding and contact layers;
        a first trench formed at least in said one or more cladding and contact layers and in said at least one grating layer, said first trench being located on a side of the waveguide ridge and extending in a direction substantially parallel to said waveguide ridge alongside said waveguide ridge, the first trench having at least a first width along a first portion thereof and a second width along a second portion thereof, the second width being greater than the first width; and
        a second trench formed at least in said one or more cladding and contact layers and in said at least one grating layer, said second trench being located on a side of the waveguide ridge opposite the side of the waveguide ridge on which the first trench is located, the second trench extending in a direction substantially parallel to said waveguide ridge alongside said waveguide ridge, the second trench having at least a first width along a first portion thereof and a second width along a second portion thereof, the second width along the second portion of the second trench being greater than the first width along the first portion of the second trench, wherein the first width of the first portions of the first and second trenches is substantially constant throughout portions of the photonic semiconductor device and wherein the second width of the second portions of the first and second trenches varies in other portions of the photonic semiconductor device over a plurality of widths, each of said plurality of widths being larger than the first width.

2. The photonic semiconductor device of claim 1, wherein the photonic semiconductor device is an electroabsorption modulator distributed feedback laser (EML) assembly, the EML device comprising an electroabsorption modulator (EAM) portion integrated and a distributed feedback laser (DFB) portion that are integrated together in the semiconductor device, the EML device having an inter-contact electrical isolation region disposed between the EAM and DFB portions to electrically isolate the EAM and DFB portions from each other.

3. The photonic semiconductor device of claim 2, wherein the first and second trenches extend substantially in parallel with each other through the DFB portion, the isolation region and the EAM portion.

4. The photonic semiconductor device of claim 3, wherein the first width of the first portions of the first and second trenches is substantially constant throughout the DFB and EAM portions and wherein the second width of the second portions of the first and second trenches varies in the isolation region over the plurality of widths.

5. The photonic semiconductor device of claim 4, wherein the waveguide ridge has a reverse-mesa configuration.

6. The photonic semiconductor device of claim 5, wherein the waveguide ridge is straight throughout the DFB portion, the isolation region and the EAM portion.

7. The photonic semiconductor device of claim 5, wherein the waveguide ridge is straight throughout the DFB portion and the isolation region and is bent throughout at least a portion of the EAM portion.

8. The photonic semiconductor device of claim 5, wherein the waveguide ridge is tilted throughout the DFB portion, the isolation region and the EAM portion.

9. A photonic semiconductor device comprising:
    a substrate having a lower surface and an upper surface;
    one or more layers including:
        at least one buffer layer having a lower surface that is in contact with the upper surface of the substrate;
        one or more multi quantum well (MQW) and confinement heterostructure (SCH) layers, one layer of said one or more MQW and SCH layers having a lower surface that is in contact with an upper surface of said at least one buffer layer;
        one or more stop etch and spacer layers, one of said one or more stop etch and spacer layers having a lower surface that is in contact with an upper surface of said one or more MQW and SCH layers;
        a grating layer having a lower surface that is in contact with an upper surface of said one or more stop etch and spacer layers;

a waveguide ridge structure formed on said grating layer, the waveguide ridge structure comprising a waveguide ridge and first and second trenches extending along first and second sides of the waveguide ridge, respectively, the trenches being formed from one or more cladding and contact layers and in said grating layer, the first trench having at least a first width along a first portion thereof and a second width along a second portion thereof, the second width being greater than the first width, said second trench being located on a side of the waveguide ridge opposite the side of the waveguide ridge on which the first trench is located, the second trench extending in a direction substantially parallel to said waveguide ridge alongside said waveguide ridge, the second trench having at least a first width along a first portion thereof and a second width along a second portion thereof, the second width along the second portion of the second trench being greater than the first width along the first portion of the second trench, wherein the first width of the first portions of the first and second trenches is substantially constant throughout portions of the photonic semiconductor device and wherein the second width of the second portions of the first and second trenches varies in other portions of the photonic semiconductor device over a plurality of widths, each of said plurality of widths being larger than the first width;

a first mini-trench formed in a first channel in said grating layer and at least partially in said one or more stop etch and spacer layers, the first mini-trench extending in a direction substantially parallel to said waveguide ridge alongside said waveguide ridge; and a second mini-trench formed in a second channel in said grating layer and at least partially in said one or more stop etch and spacer layers, the second mini-trench extending in a direction substantially parallel to said waveguide ridge alongside said waveguide ridge, the first and second mini-trenches providing an isolation region of the semiconductor device with a relatively high resistance and a relatively low parasitic capacitance.

10. The photonic semiconductor device of claim 9, wherein the photonic semiconductor device is an electroabsorption modulator distributed feedback laser (EML) assembly, the EML device comprising an electroabsorption modulator (EAM) portion integrated and a distributed feedback laser (DFB) portion that are integrated together in the semiconductor device, wherein said isolation region is an inter-contact electrical isolation region disposed between the EAM and DFB portions to electrically isolate the EAM and DFB portions from each other.

11. The photonic semiconductor device of claim 10, wherein the first and second mini-trenches each have a width that is substantially constant throughout the EAM portion and isolation region.

12. The photonic semiconductor device of claim 10, wherein the waveguide ridge has a reverse-mesa configuration.

13. A method for fabricating a photonic semiconductor device, the method comprising:

providing a substrate having a lower surface and an upper surface;

forming one or more layers on the substrate, said one or more layers including:

at least one buffer layer having a lower surface that is in contact with the upper surface of the substrate;

one or more multi quantum well (MQW) and confinement heterostructure (SCH) layers, one layer of said one or more MQW and SCH layers having a lower surface that is in contact with an upper surface of said at least one buffer layer;

at least one grating layer having a lower surface that is in contact with an upper surface of said one or more MQW and SCH layers, at least a portion of the grating layer having a periodically varying refractive index region therein; and one or more cladding and contact layers, one of said one or more cladding and contact layers having a lower surface that is in contact with an upper surface of said at least one grating layer;

forming a waveguide ridge in at least said one or more cladding and contact layers;

forming a first trench at least in said one or more cladding and contact layers and in said at least one grating layer, said first trench being located on a side of the waveguide ridge and extending in a direction substantially parallel to said waveguide ridge alongside said waveguide ridge, the first trench having at least a first width along a first portion thereof and a second width along a second portion thereof, the second width being greater than the first width; and forming a second trench at least in said one or more cladding and contact layers and in said at least one grating layer, said second trench being located on a side of the waveguide ridge opposite the side of the waveguide ridge on which the first trench is located, the second trench extending in a direction substantially parallel to said waveguide ridge alongside said waveguide ridge, the second trench having at least a first width along a first portion thereof and a second width along a second portion thereof, the second width along the second portion of the second trench being greater than the first width along the first portion of the second trench, wherein the first width of the first portions of the first and second trenches is substantially constant throughout portions of the photonic semiconductor device and wherein the second width of the second portions of the first and second trenches varies in other portions of the photonic semiconductor device over a plurality of widths, each of said plurality of widths being larger than the first width.

14. The method of claim 13, wherein the photonic semiconductor device is an electroabsorption modulator distributed feedback laser (EML) assembly, the EML device comprising an electroabsorption modulator (EAM) portion integrated and a distributed feedback laser (DFB) portion that are integrated together in the semiconductor device, the EML device having an inter-contact electrical isolation region disposed between the EAM and DFB portions to electrically isolate the EAM and DFB portions from each other.

15. The method of claim 14, wherein the first and second trenches extend substantially in parallel with each other through the DFB portion, the isolation region and the EAM portion.

16. The method of claim 15, wherein the first width of the first portions of the first and second trenches is substantially constant throughout the DFB and EAM portions and wherein the second width of the second portions of the first and second trenches varies in the isolation region over the plurality of widths.

17. The method of claim 14, further comprising: forming at least first and second mini-trenches in the EML device such that the first and second mini-trenches are located on opposite sides of the waveguide ridge and extend throughout the EAM portion and the isolation region substantially in parallel with the waveguide ridge, and wherein the first mini-trench is located between said first trench and the waveguide ridge, and wherein the second mini-trench is located between said second trench and the waveguide ridge, the first and second mini-trenches providing the isolation region with a relatively high resistance and a relatively low parasitic capacitance.

18. The method of claim 17, wherein the first and second mini-trenches each have a width that is substantially constant throughout the EAM portion and isolation region, and wherein the width of the first and second mini-trenches is smaller than the first width of the first portions of said first and second trenches.

19. The method of claim 18, wherein in the EAM portion the first and second mini-trenches are formed in at least one cladding and one contact layer of said one or more cladding and contact layers, and wherein in the isolation region, the mini-trenches are formed in at least one cladding layer of said one or more cladding and contact layers.

* * * * *